United States Patent
Martinez-Tovar et al.

[11] Patent Number: 6,054,760
[45] Date of Patent: Apr. 25, 2000

[54] SURFACE-CONNECTABLE SEMICONDUCTOR BRIDGE ELEMENTS AND DEVICES INCLUDING THE SAME

[75] Inventors: Bernardo Martinez-Tovar; John A. Montoya, both of Albuquerque, N. Mex.

[73] Assignee: SCB Technologies Inc., Albuquerque, N. Mex.

[21] Appl. No.: 08/771,536

[22] Filed: Dec. 23, 1996

[51] Int. Cl.⁷ .................................................. H01L 23/48
[52] U.S. Cl. ......................... 257/692; 257/778; 257/786
[58] Field of Search .................................. 257/692, 778, 257/786, 737; 102/202.7, 202.5

[56] References Cited

U.S. PATENT DOCUMENTS

| | | |
|---|---|---|
| 3,196,041 | 7/1965 | McNulty . |
| 3,292,537 | 12/1966 | Goss, Jr. . |
| 3,366,055 | 1/1968 | Hollander, Jr. . |
| 3,763,782 | 10/1973 | Bendler et al. . |
| 4,044,222 | 8/1977 | Kestenbaum . |
| 4,381,692 | 5/1983 | Weintraub . |
| 4,393,779 | 7/1983 | Brede et al. . |
| 4,405,933 | 9/1983 | Avery . |
| 4,559,875 | 12/1985 | Marshall . |
| 4,649,821 | 3/1987 | Marshall et al. . |
| 4,649,875 | 3/1987 | Mirone et al. . |
| 4,700,263 | 10/1987 | Marshall et al. . |
| 4,708,060 | 11/1987 | Bickes, Jr. et al. . |
| 4,729,315 | 3/1988 | Proffit et al. . |
| 4,843,964 | 7/1989 | Bickes, Jr. et al. . |
| 4,930,418 | 6/1990 | Folsom . |
| 4,934,804 | 6/1990 | Folsom . |
| 4,976,200 | 12/1990 | Benson et al. . |
| 5,010,822 | 4/1991 | Folsom . |
| 5,029,529 | 7/1991 | Mandigo et al. . |
| 5,036,767 | 8/1991 | Folsom et al. . |
| 5,080,016 | 1/1992 | Osher . |
| 5,113,764 | 5/1992 | Mandigo et al. . |
| 5,173,958 | 12/1992 | Folsom et al. . |
| 5,179,248 | 1/1993 | Hartman et al. . |
| 5,206,455 | 4/1993 | Williams et al. . |

(List continued on next page.)

FOREIGN PATENT DOCUMENTS

| | | |
|---|---|---|
| 816530 | 7/1959 | United Kingdom . |
| 94/19661 | 9/1994 | WIPO . |

OTHER PUBLICATIONS

Brochure for "Conventional SCB" by Quantic Industries, Inc.—all pages.

*Primary Examiner*—Carl Whitehead, Jr.
*Assistant Examiner*—Roy Potter
*Attorney, Agent, or Firm*—Law Office of Victor E. Libert

[57] ABSTRACT

A semiconductor element, e.g., a semiconductor bridge element (30), is surface mountable as it has thereon a metal layer comprised of metal lands (44) and electrical connectors 45a, 45b and 45c) which terminate in flat electrical contacts (47) on the back surface (35) of the element. Optionally, the element may also contain back-to-back zener diodes (46a, 46b) to provide unbiased protection against electrostatic discharge. When configured as a semiconductor bridge element (30), the element, among other uses, finds use as an igniter (13) for an explosive element. The elements may be made by a method including a cross-cut technique in which grooves (60) cut in the front surface (58) of a silicon wafer substrate (56) intersect grooves (64) cut in the back surface (62) of the wafer. The intersecting grooves (60,64) form a plurality of apertures in the wafer (56), the apertures and grooves helping to define a plurality of dies having side surfaces. A dielectric layer (48) is deposited on the wafer (56) and a polysilicon film (52) is deposited over the dielectric layer (48). A metal layer (44, 45a–45c, and 47) is then deposited on the wafer while it is still intact to provide an electrical connection from the top surface (34) of element (30) along the side surfaces (66a, 66b and 66c, and 68a, 68b and 66c) to the bottom surface (35) to constitute the dies as the semiconductor elements (30). The elements (30) are separated and the electrical contacts (47) of a given element can be mounted directly to a header (36) or the like by soldering, without need for connector wires (14).

13 Claims, 4 Drawing Sheets

U.S. PATENT DOCUMENTS

| | | |
|---|---|---|
| 5,230,287 | 7/1993 | Arrell, Jr. et al. . |
| 5,243,492 | 9/1993 | Marquit et al. . |
| 5,255,277 | 10/1993 | Carvalho . |
| 5,285,727 | 2/1994 | Reams, Jr. et al. . |
| 5,294,567 | 3/1994 | Dorfman et al. . |
| 5,309,841 | 5/1994 | Hartman et al. . |
| 5,327,834 | 7/1994 | Atkeson . |
| 5,334,306 | 8/1994 | Dautremont-Smith . |
| 5,347,159 | 9/1994 | Khandros et al. ............... 257/692 |
| 5,359,192 | 10/1994 | Williams et al. . |
| 5,385,097 | 1/1995 | Hruska et al. . |
| 5,403,036 | 4/1995 | Zakula et al. . |
| 5,454,320 | 10/1995 | Hilden et al. . |
| 5,473,623 | 12/1995 | Fahey et al. . |
| 5,500,546 | 3/1996 | Marum et al. . |
| 5,684,677 | 11/1997 | Uchida et al. ..................... 257/786 |

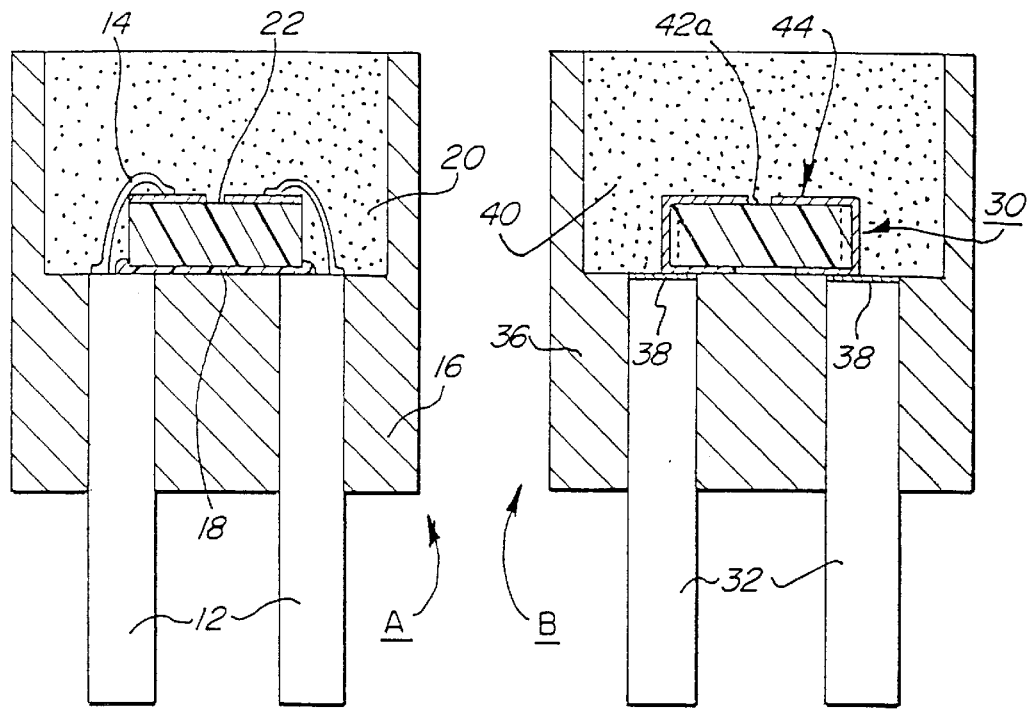
FIG. 1 (PRIOR ART)
FIG. 3
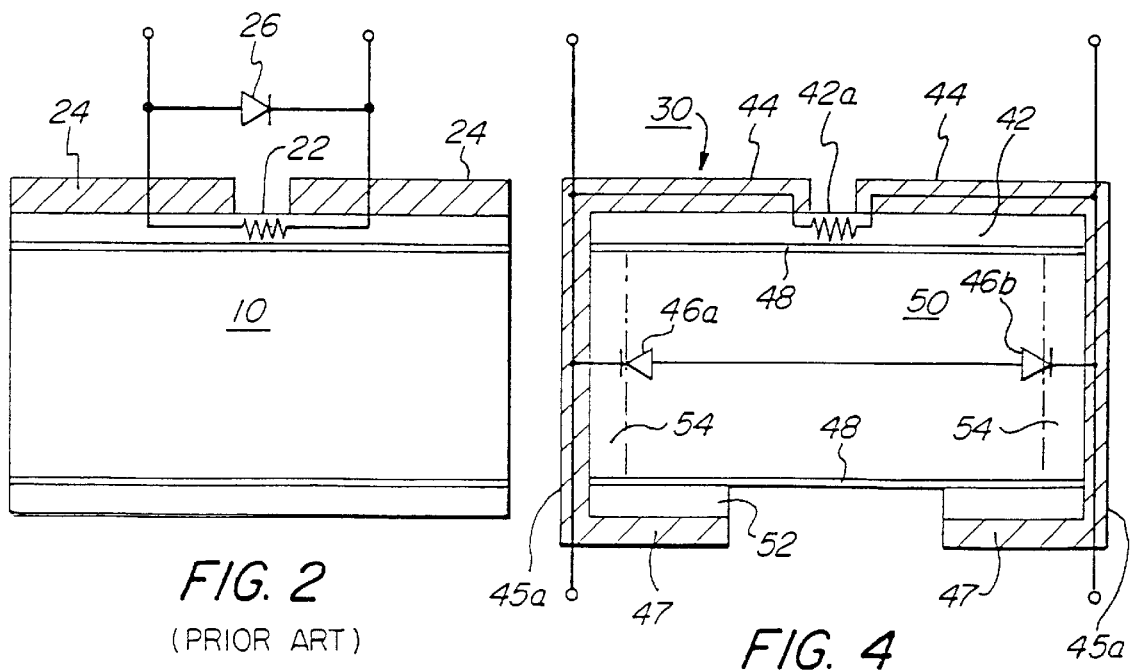
FIG. 2 (PRIOR ART)
FIG. 4

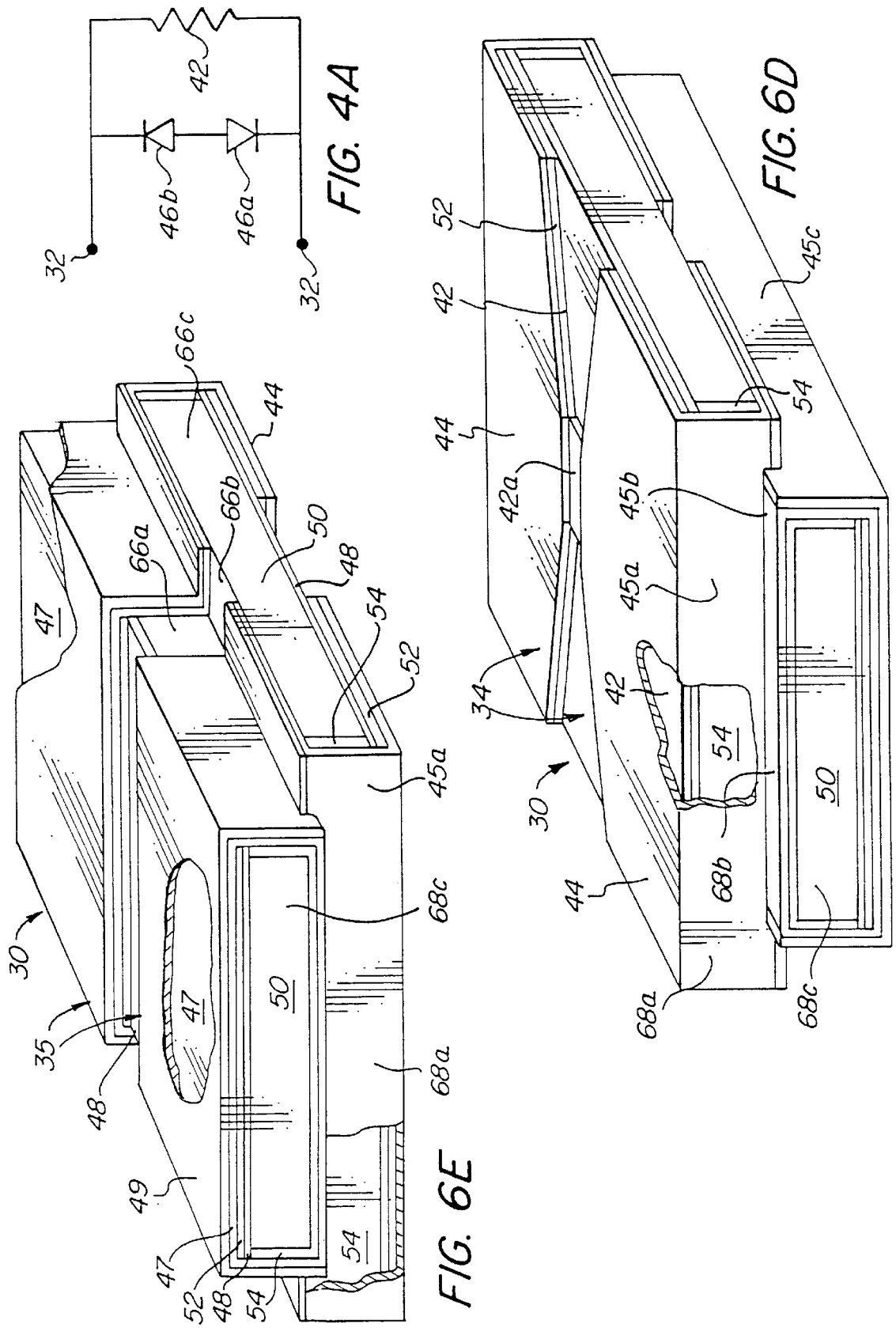

SURFACE-CONNECTABLE SEMICONDUCTOR BRIDGE ELEMENTS AND DEVICES INCLUDING THE SAME

BACKGROUND OF THE INVENTION

1. Field of the Invention

The present invention is concerned with semiconductor elements, e.g., semiconductor bridge elements, which are surface-connectable and may optionally have polarity-independent electrostatic discharge protection, with devices including such semiconductor elements, and to methods of making such elements and devices. More particularly, the present invention is concerned with a semiconductor element having an electrically conductive coating extending from the top to the bottom surface thereof, a semiconductor element protected against electrostatic discharge by back-to-back zener diodes, methods of manufacturing such elements, and methods of manufacturing devices including the same.

2. Related Art

Semiconductor bridge ("SCB") elements (sometimes herein referred to as "chips") and means to electrically connect them for the purpose of electrical activation are well-known in the art. Presently, both the SCB of U.S. Pat. No. 4,708,060, to Bickes, Jr. et al, issued Nov. 24, 1987, and the tungsten bridge SCB of U.S. Pat. No. 4,976,200 to Benson et al, issued Dec. 11, 1990, are manufactured with large metalized pads for electrical contact to the active area of the bridge. The SCB chip generally is mechanically bonded to an attachment surface (of a header or other element) with epoxy adhesive. The standard electrical connection is then made to the top of the chip by wire-bonding, that is, by attaching wires from the metalized lands of the chip to the appropriate electrical contacts of the header. Proper functioning of the SCB in a detonator requires intimate contact with an energetic material such as an explosive or pyrotechnic material, and this demands an upright position for the chip; that is, the chip cannot be assembled with its active area positioned against the header, but its active area must face towards and contact the energetic material so that the active area is free to interact with the energetic material.

International Pat. WO 94/19661 to Willis, published Sep. 1, 1994, discloses a wrap-around conductive layer which is manufactured by cutting a channel in the wafer, metal plating the wafer, etching the bottom of the wafer and then metal plating the back. U.S. Pat. No. 5,080,016 to Osher, issued Jan. 14, 1992, discloses a conductor which wraps around the dielectric block and occupies the entire back surface thereof.

The prior art also provides for protecting SCB chips against electrostatic discharge. The SCBs of U.S. Pat. No. 5,179,248 to Hartman et al, issued Jan. 12, 1993, and of U.S. Pat. No. 5,309,841 to Hartman et al, issued May 10, 1994, are manufactured with large metalized pads to provide electrical contacts for energizing the active area of the bridge. These patents also show the use of a single zener diode (in discrete or on-chip integrated form) connected in parallel with the SCB for protection against unwanted electrostatic discharge ("ESD")and EMI voltages.

U.S. Pat. No. 5,327,832 to Atkeson, issued Jul. 12, 1994, shows unbiased discharge protection for a three conductor field-effect transistor. U.S. Pat. No. 5,500,546 to Marum, issued on Mar. 19, 1996, discloses multiple diodes for electrostatic discharge protection. However, these components are located in a separate control circuit for the operational circuitry.

It would be desirable to provide a surface-connectable SCB which can be easily manufactured with intrinsic, unbiased ESD protection.

SUMMARY OF THE INVENTION

Generally, the present invention provides a semiconductor element having flat electrical contacts on the back surface thereof. For example, flat electrical contacts may be provided on the back surface of SCB elements (chips) which often are used in functions which demand an upright position for the chip. For example, some SCB applications demand that the front surface of the semiconductor chip be in intimate contact with an explosive or other type of energetic material that is press-loaded in a receptacle that contains the SCB chip attached and wire-bonded to a chip carrier, package, or header. (The term "header" is used in the claims to denote any suitable surface or structure to which the element may be electrically connected.) The invention encompasses semiconductor elements that may comprise simple two- or three-wire elements such as semiconductor bridge elements, diodes, capacitors, rectifiers and the like.

Another general aspect of the present invention is to provide polarity-independent (unbiased) electrostatic discharge protection to the semiconductor element by providing zener diodes electrically connected in a back-to-back configuration. When employed in conjunction with a semiconductor bridge element, the zener diodes are connected in parallel with the semiconductor bridge circuitry. Both semiconductor bridge elements and zener diodes may be fabricated on the same chip with the zener diodes being constructed on the side walls of the semiconductor chip by means of a side metal layer in contact with a diffused layer containing dopant of a type opposite to that of the substrate of the semiconductor.

Specifically, in accordance with the present invention there is provided a method for manufacturing a plurality of semiconductor elements from a substrate wafer having a front surface and a back surface. The method comprises the following steps. At least one surface of a silicon substrate wafer is coated with a dielectric layer and a polysilicon film is deposited on the dielectric layer. A plurality of openings is formed in, and each opening extends through, the substrate wafer from the front surface to the back surface thereof to define side surfaces which extend from the front surface to the back surface of the wafer, the openings being located so that a plurality of dies to be cut from the substrate wafer each has an opposed pair of the side surfaces. A metal layer is deposited on the wafer and through the openings onto the front, back and side surfaces to provide a continuous electrically conductive path on the dies between the front surface and the back surface via the side surfaces. The polysilicon film and the metal layer are masked and etched to form desired circuitry on the dies to constitute the semiconductor elements from the dies. The semiconductor elements are then separated from the substrate wafer and from each other.

According to one aspect of the invention, the semiconductor elements may comprise semiconductor bridge elements, and the method may further include the step of masking and etching the polysilicon film and the metal layer to form at least two separate electrical contacts on the back surface and a semiconductor bridge circuit geometry on the front surface.

Another aspect of the invention provides that the silicon substrate wafer is selected from the class consisting of p-type substrates and n-type substrates and further includes the following step. Prior to depositing the aforesaid metal layer, the polysilicon film and the side surfaces of the silicon substrate wafer are doped with a dopant selected from the class consisting of a p-dopant and an n-dopant, under the following conditions. When the substrate comprises a p-type substrate the polysilicon film and side surfaces are doped with an n-dopant, and when the substrate comprises an n-type substrate the polysilicon film and side surfaces are doped with a p-dopant. In this way, doping of the polysilicon film and the side surfaces forms back-to-back diode means between opposite ones of the side surfaces to provide each eventual semiconductor element with unbiased protection against electrostatic discharge.

In another aspect of the present invention, the plurality of openings is formed in the substrate wafer by cutting a first plurality of grooves through the front surface of the substrate wafer and cutting a second plurality of grooves through the back surface of the substrate wafer transversely, e.g., perpendicularly, to the first plurality of grooves. The first and second plurality of grooves are cut deeply enough so that the first plurality of grooves intersects the second plurality of grooves at intersections to form a series of apertures at the intersections, the apertures and their associated grooves cooperating to define a plurality of the side surfaces. The grooves of the first plurality of grooves may be cut parallel to and equally spaced from each other, and those of the second plurality of grooves may be cut parallel to and equally spaced from each other.

Yet another method aspect of the present invention provides for mounting individual semiconductor bridge elements directly to a header by soldering the metal layer on the back surface to electrical contacts on the header.

In accordance with the present invention there is also provided a surface-connectable semiconductor element comprising the following elements. A substrate made from a silicon semiconductor material that has a top surface, a bottom surface, and side surfaces has a dielectric layer disposed on at least one surface of the substrate. A polysilicon film is disposed on the dielectric layer and a metal layer is mounted on the polysilicon layer and extends from the top surface, along the side surfaces, to the bottom surface. The polysilicon film and metal layer are configured to form contacts on the bottom surface, which contacts are configured for surface mounting directly on a header, i.e., they are substantially flat.

Other aspects of the invention provide the following features alone or in combination. The aforesaid element may comprise a semiconductor bridge element wherein the polysilicon film and the metal layer are configured to provide at least two separate electrical contacts on the back surface and semiconductor bridge circuit geometry on the front surface; and the substrate is selected from the class consisting of p-type substrates and n-type substrates and the polysilicon film and the side surfaces of the substrate are doped with a dopant selected from the class consisting of a p-dopant and an n-dopant, provided that when the substrate comprises a p-dopant the polysilicon film and the side surfaces are doped with an n-dopant, and when the substrate comprises an n-dopant the polysilicon film and the side surfaces are doped with a p-dopant, so that back-to-back diode means are formed between opposite ones of the side surfaces to provide the semiconductor element with unbiased protection against electrostatic discharge.

Other aspects of the present invention provide for the substrate to have a resistivity in the range of from about 0.01 to 10 ohm-cm, the dielectric layer to have a thickness in the range of from about 0.2 to 1 micrometer, and the polysilicon film to have a thickness in the range of from about 1 to 3 micrometers.

Still another aspect of the invention provides for the aforesaid semiconductor element to be in combination with a header having electrical contacts, wherein the element is surface mounted directly on the header by soldering the contacts of the bottom surface of the element to the contacts of the header.

The semiconductor element may, in one aspect of the invention, form part of an explosive element and have the bridge circuit geometry thereof disposed in contact with an explosive material.

The invention further provides for a semiconductor element made in accordance with the methods described above.

Other aspects of the present invention are disclosed in the following description.

BRIEF DESCRIPTION OF THE DRAWINGS

FIG. 1 is a cross-sectional view of a prior art explosive initiator including a prior art semiconductor bridge igniter;

FIG. 2 is an enlarged electrical schematic view of the prior art semiconductor bridge igniter of FIG. 1;

FIG. 3 is a cross-sectional view of an explosive initiator including a surface-connectable semiconductor bridge element as an igniter, the element having diodes which provide unbiased electrostatic discharge protection according to one embodiment of the present invention;

FIG. 4 is an electrical schematic diagram of the surface-connectable semiconductor bridge element of FIG. 3;

FIG. 4A is an electrical schematic diagram of the diodes of the element of FIG. 4;

FIG. 6D is a perspective view of the top surface of the semiconductor bridge element of FIG. 6; and FIG. 6E is a perspective view of the bottom surface of the semiconductor bridge element of FIG. 6.

DETAILED DESCRIPTION OF THE INVENTION AND SPECIFIC EMBODIMENTS THEREOF

Figure 5:
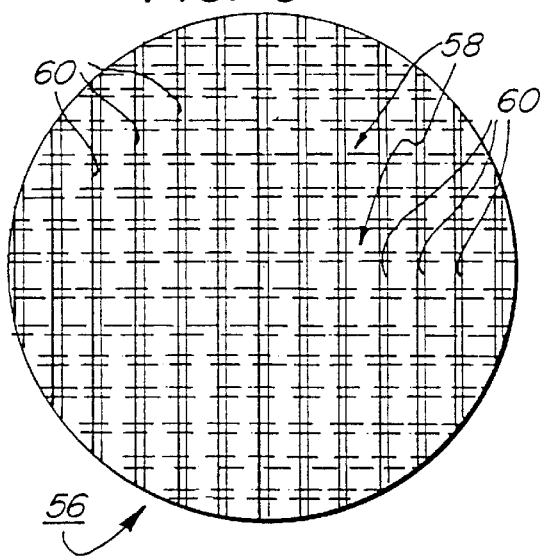
FIG. 5 is a schematic top view of a silicon wafer which has been cross-cut in accordance with one aspect of the present invention in an early stage of the manufacture of semiconductor elements from the wafer.

The present invention eliminates the wire-bonding and die-bonding techniques of prior art semiconductor chip structures, i.e., semiconductor devices or elements, that by their nature require the use of special equipment, tooling, glues and epoxies to attach a semiconductor chip to a package which must then be processed at a wire-bonding station to provide wire electrical connections to the chip and the package. With the surface-connectable elements, e.g., SCBs, of the present invention, use of special glues and epoxies as well as their respective curing cycles needed to attach the chips to a package are eliminated. Instead, standard solder reflow techniques, which are simpler, easier and cheaper than wire-bonding and die-bonding, are used to provide strong and cost-effective electrical connections. The present invention can be practiced with a variety of semiconductor elements, including two- and three-terminal elements such as SCBs, diodes, capacitors, rectifiers and the like. The method of manufacturing surface-connectable semiconductor elements, e.g., SCBs, of the present invention includes providing the elements with electrical contacts which are connectable from the back side of the semiconductor elements. The method of the invention provides for making these electrical contacts at the mass production (wafer) level, thereby decreasing the cost, time and complexity of the manufacture and eventual assembly of the semiconductor elements. In addition, process integration (at wafer level) of the surface-connectable elements can more easily be achieved, as can be appreciated by those skilled in the art.

The present invention also provides for an unbiased, electrostatic discharge zener diode-protected semiconductor element, e.g., an SCB chip, with electrical contacts to its back side without the need to increase the area of the chip to accommodate electrical contacts as is the case with the prior art structures.

The present invention also offers advantages in electrically connecting the semiconductor elements, for a wider range of applications, including those which cannot readily accommodate wire-bonding. For example, surface-connectable SCB chips in accordance with the invention can be directly assembled on any flat, hard or even relatively soft surface; on headers with deep and narrow cavities; on flexible circuits; on lead frames; and on many more complex packages that are not suitable for having chips bonded to them or on which chips can be bonded only with extreme difficulty with the prior art techniques, because of physical, mechanical and thermal constraints.

The surface-connectable semiconductor elements of the present invention also offer a very small maximum elevation or thickness (good planarity) of from about 1 to 3 microns between the active area of the semiconductor element and the uppermost metal layer on the element, over a fairly large area, typically one square millimeter ("mm$^2$") or larger. This is achieved by eliminating the use of bonding wires that are typically equal to or larger than 0.005 inches (about 125 microns) thick. The wires normally exhibit a loop height of at least twice the wire thickness above the active area of the bridge.

One of the contemplated configurations of the semiconductor elements of the present invention is as SCBs, a primary use of which is to serve as part of an igniter for explosive elements. As is known to those skilled in the art, an SCB element may serve as an igniter for explosives and displays superior characteristics with respect to safety and reliability as compared to conventional hot wire igniters. By passage of an electrical current through leads 12 of the prior art element of FIG. 1, or through leads 32 of the embodiment of the invention of FIG. 3, the active area (shown at 22 in the prior art element of FIG. 1 and at 42a in the embodiment of FIG. 3) will generate a plasma discharge sufficient to ignite, respectively, the explosive load 20 of the prior art element of FIG. 1 or the explosive load 40 of the embodiment of FIG. 3. Explosive loads 20 and 40 may be any suitable energetic material, e.g., a primary explosive such as lead azide, or other suitable explosive material.

With the good planarity, i.e., flatness, offered by the structures of the present invention, energetic materials in the form of powder, foils, pellets, etc., can be brought into intimate contact with the active area of the SCB without any structures, such as loops of connector wire, being interposed between the SCB and the explosive load. This is of significance because the explosive load 20 (FIG. 1) or 40 (FIG. 3) is usually compressed at high pressure, measured in thousands of pounds per square inch, against the active area 22 (FIG. 1) or 42a (FIG. 3). The present invention eliminates one of the leading causes of failure in any standard SCB igniter, the wire itself (item 14 in the prior art structure of FIG. 1), which has the potential of becoming loose or breaking during such high pressure powder pressings. Such prior art semiconductor bridge utilized as part of an explosives igniter A is shown in FIG. 1 wherein SCB 10 is connected to leads 12 by wires 14. SCB 10 is affixed to header 16 by epoxy 18. Header 16 contains an explosive load 20 in contact with an active area 22 of SCB 10. FIG. 2 shows the prior art SCB 10 with metal lands 24. The schematically illustrated circuit of FIG. 2 shows the electrical effect of appropriate doping of the substrate of SCB 10 to provide a diode 26, connected between lands 24 in parallel to the resistance offered by the active area 22 of SCB 10. This known arrangement provides electrostatic discharge protection only when SCB 10 is connected via leads 12 with proper polarization.

FIG. 3 shows a surface-connectable SCB 30 in accordance with an embodiment of the present invention. SCB 30 is also provided with unbiased protection against electrostatic discharge according to a particular optional aspect of the present invention and is shown being utilized as part of an explosives igniter B wherein SCB 30 is attached, i.e., is surface-connected, to leads 32 of header 36 by solder joints 38. An explosive load 40 is in contact with active area 42a, which is formed in the gap between lands 44. As seen in FIG. 4, SCB 30 comprises a silicon dioxide layer 48 disposed on a p-type silicon substrate 50. A polysilicon film 52 is disposed on portions of the silicon dioxide layer 48. On either side of SCB 30, dopant impurities 54 are introduced into the p-type silicon substrate 50. (In an alternate embodiment, the substrate 50 may consist of an n-type silicon substrate and the dopant impurities 54 may consist of p-type dopant impurities.) The metal lands 44 extend along the exterior top surface of substrate 50 and are connected by electrical connector 45a to contact lands 47 on the back surface of substrate 50. The dopant impurities 54 adjacent the lands 44 establishes back-to-back diodes 46a and 46b, which provide unbiased electrostatic discharge protection to SCB 30. In other words, SCB 30 includes electrostatic discharge protection regardless of the polarity of the connections to leads 32. The electrostatic discharge protection provided by the back-to-back diodes is not needed in every case, but provides protection for smaller semiconductor elements and in applications, such as initiation of explosives, where such added protection is warranted.

FIG. 4A shows the schematic diagram of FIG. 4 related to the structure of SCB 30 wherein back-to-back diodes 46a, 46b are connected in parallel to the resistance provided by active area 42a. When a voltage is supplied to SCB 30 through leads 32, most of the current will initially flow through the active area 42a of SCB 30 until the diodes reach their intrinsic breakdown voltage, at which time current will flow to the zener diodes 46a, 46b. For very high spikes of voltage, as are encountered by electrostatic discharge, the diodes 46a, 46b will beak down and shunt the current therethrough, thereby decreasing the amount of current flow through active area 42a of SCB 30.

The circuitry for the semiconductor bridge according to the invention is manufactured with standard techniques from a standard silicon substrate, commonly referred to as a wafer or wafer substrate. While the silicon substrate has no preferred crystal orientation, the background substrate concentration is preferably in the range $10^{14}$ to $10^{18}$ $cm^3$ and is optionally doped with suitable impurities to isolate the substrate's resistance, as explained below.

The fabrication process is then followed by creating the active elements or circuits on the silicon substrate in such a way that the electrical contact pads or layers are extended continuously from one to the opposite side of the chip. Even though the surface mounting technique of the present invention applies to many circuit or element configurations such as diodes, transistors, resistors, capacitors, and any other discrete semiconductor component with two or three terminals, the following discussion will refer, by way of illustration, to SCBs. SCB technology relies on the use of thin films (mono-and poly-crystalline silicon) that are electrically isolated from their substrates by means of dielectric or non-conductive layers.

The fabrication of surface-connectable SCB elements, in accordance with the present invention, may, for example, start with p-type, high resistivity (0.01 to 10 ohm-cm) silicon substrates that are coated on the front and on the back with a dielectric layer, typically from 0.2–1.0 micrometers thick, on which a polysilicon film, typically 1.0–3.0 micrometers thick, is deposited by techniques well-known by those skilled in the art. For example, the polysilicon film deposition may be carried out by low pressure chemical vapor deposition of polysilicon on silicon dioxide films that are thermally grown on the silicon substrate at high temperatures in a controlled oxygen-water steam atmosphere.

Next, the silicon substrates are subjected to the hole-, groove-, or channel-making process, as follows. In one approach, laser drilling of holes can be done at selective locations on the substrate with at least a pair of holes for every element on the wafer. In another approach, chemical etching of grooves on the silicon substrate can also be done at selective locations on the wafer with at least one groove separating two adjacent elements. In another approach, channels and stripes can be added by saw-dicing of the wafer creating cuts in only one direction and all the way through, but not all the way across, so as to define an array of parallel strips supported by a peripheral edge portion of the wafer.

In a preferred approach in accordance with an aspect of the present invention, a saw dicing technique is used to cut in the wafer substrate openings which define between them areas of the substrate which form dies which are subsequently, after formation of the required circuitry thereon, cut from the wafer to provide a plurality of semiconductor elements from a single wafer substrate. The cutting technique employed in accordance with the invention forms square through-holes (which extend through the entire depth of the wafer and any coatings thereon) from the front surface to the back surface of the wafer. The through-holes are formed by cutting the wafer partially through on the front surface and on the back surface, with the front surface cuts extending transversely, e.g., perpendicularly, to the back surface cuts. Both cuts are deep enough, e.g., each may extend through more than one-half the thickness of the wafer, such that they form squared holes at their intersections and thereby provide a plurality of passages which extend from the front to the back of the wafer. Both the back surface and front surface cuts or grooves are made wide enough so that the subsequent cutting of the wafer to separate the semiconductor elements therefrom can be carried out with a thinner dicing saw which will leave intact and unscathed the side-walls formed by the initial front surface and back surface cuts.

Figure 5A:
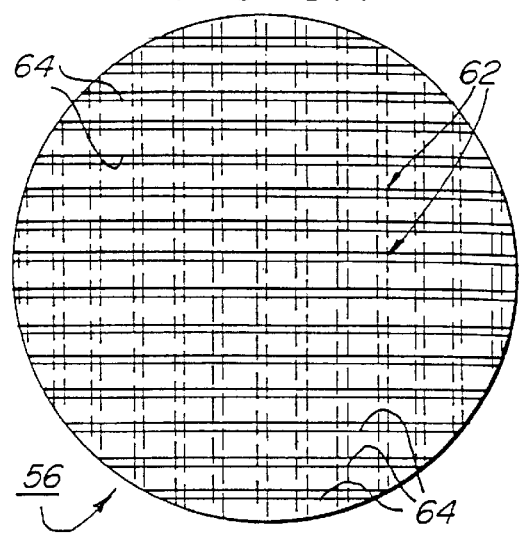
FIG. 5A is a bottom view of the wafer of FIG. 5.
Figure 5B:
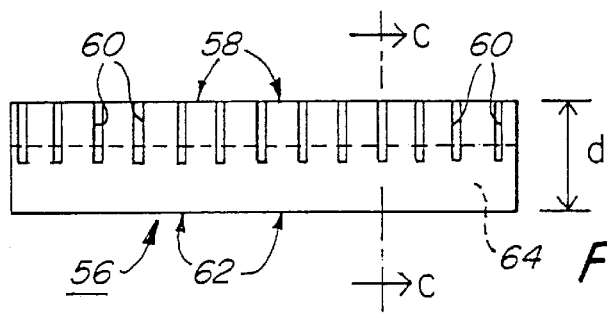
FIG. 5B is a side view of the wafer of FIG. 5.
Figure 5C:
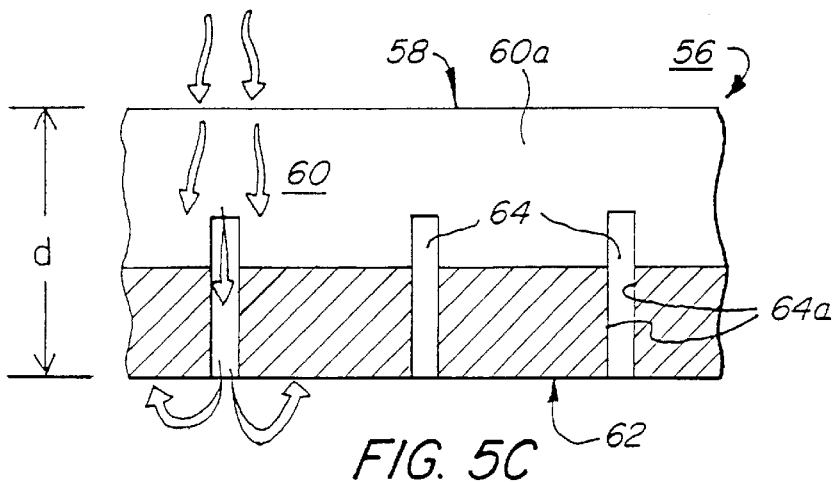
FIG. 5C is a partial cross-sectional view, enlarged with respect to FIG. 5B, taken along line C—C of FIG. 5B.

Referring now to FIGS. 5, 5A, 5B and 5C, a wafer substrate 56 is shown in schematic view, and greatly enlarged in thickness for purposes of illustration. FIG. 5 shows the front surface 58 in plan view, having a series of parallel, equally spaced-apart front surface grooves 60 cut therein. As seen in FIG. 5B, front surface grooves 60 extend for slightly more than half the depth d of wafer substrate 56. FIG. 5A shows back surface 62 of wafer substrate 56, which has a series of parallel, equally spaced-apart back surface grooves 64 formed therein. Back surface grooves 64, as best seen in FIG. 5C, are substantially equal in depth to front surface grooves 60 and extend for slightly more than one-half the depth d of wafer substrate 56.

The intersections of front surface grooves 60 and back surface grooves 64 result in a plurality of square openings (unnumbered) formed by the intersections of the various grooves, and provide access between the walls 60a (only one of which is shown in FIG. 5C) defining front surface grooves 60 and the walls 64a defining back surface grooves 64. Respective portions of walls 60a, 64a comprise the side surfaces (66a–66c and 68a–68b in, respectively, FIGS. 6D and 6E) of the elements to be cut from wafer substrate 56. Consequently, a flow path is provided as indicated by the unnumbered curved arrows in FIG. 5C for the gaseous reactant utilized in a gaseous thermal diffusion process to dope front surface 58, the walls of front surface grooves 60, the walls of back surface grooves 64, and back surface 62.

When the thermal diffusion process and other processing steps necessary are completed, saw cuts are extended through the entire thickness of wafer substrate 56 to form a plurality of dies on which the appropriate SCB circuitry has been formed to provide a plurality of SCB elements. By using the illustrated technique, the wafer substrate 56 maintains its physical integrity and the processing steps may be carried out on the full wafer.

When it is desired to form back-to-back zener diodes on the dies, the p-doped silicon substrate is, after the formation of openings therein, preferably by the cross-cutting technique illustrated in FIGS. 5–5C, subjected to an n-type gaseous thermal diffusion process, for example, one using phosphorus oxychloride ($POCl_3$). Phosphorus oxychloride provides a gaseous source of phosphorus impurities upon reacting with oxygen and nitrogen supplied in appropriate proportions at high temperature.

The flow path of the phosphorus oxychloride is illustrated by the unnumbered curved arrows in FIG. 5C, as described above. The front and back polysilicon layer and the eventual side surfaces of the silicon substrate of every die on the wafer is thus doped by the gaseous diffusion process. The use of a gaseous diffusion process is demanded by the requirement of having continuous electrically conductive paths established from the front to the back surface by means of the side surfaces through the holes, channels or grooves formed in the wafer. It will also be appreciated that by doping the side surfaces of the silicon dies with n-type impurities, electrical isolation between the two opposite side walls of every die is achieved by defining back-to-back diodes (when a p-type silicon substrate is used as mentioned above) that can be used as electrical components to protect the surface-connectable SCB from the effects of electrostatic discharges.

In another aspect of the present invention, an n-type silicon substrate and a p-type gaseous thermal diffusion process can also be used to provide the electrical isolation between the two opposite side walls of every die. This is achieved by providing the intrinsic back-to-back zener diodes to protect the surface-connectable SCB from the effects of electrostatic discharges.

Both the silicon substrate and the doping gaseous source can, in accordance with another embodiment of the present invention, be selected to be of the same type, either p- or n-type, to provide the continuous electrically conductive paths needed to connect the front and back surfaces of the dies. However, the electrical isolation between the two opposite sides of every die is then not achieved (back-to-back diodes are not formed in this way) since only a simple resistive path is obtained which, under the right circumstances, can be intentionally designed to be of very high resistance, depending upon the doping level of the starting silicon substrate. It will be appreciated by those skilled in the art that this latter scenario will not provide elements which protect against electrostatic discharge.

In any case, after removing the excess of dopant left (namely phosphorus-silicate glass or PSG) during the diffusion process with a buffered oxide etching solution, a first metal layer consisting of aluminum, tungsten or any other suitable metal, is deposited on the front and back side of the polysilicon wafer by any suitable standard deposition technique, for example, thermal evaporation, sputtering, etc. During the metal depositions the wafers are rotated in a planetary-type system so as to expose to the metal being deposited as much surface area of the wafer as possible. This rotational effect helps to overcome the effect on metal deposition of "shadows" cast by nearby structures and promotes the formation of thick and uniform metal coatings on the side walls of the substrate. The width of the groove and channel, as well as the diameter of the hole, influences the quality of the side metalization layer.

As will be appreciated by those skilled in the art, if a chemical vapor deposition technique is used to metalize the wafer with tungsten, aluminum, copper or the like, then the need to rotate the wafers is eliminated as a more conformable deposition is achieved.

Photo-lithography techniques and specially designed photographic plates, well-known to those skilled in the art, are used to transfer images onto the silicon substrates at selected areas to create a mask that protects those selected areas against chemical etching agents. Etching and washing techniques are then carried out so as to define specific geometries on the silicon substrates. In particular, etching and washing of aluminum and polysilicon is carried out to define the SCB geometry on the front surface and to separate the metal contacts on the back surface of the wafer. The back side of the wafer is protected (e.g., with photo-resist) against chemical etchants during the etching of aluminum and polysilicon on the front surface, and vice versa.

When the metal layer comprises aluminum, thermal treatment of the wafers is then performed at 450° C. for 30 minutes in a nitrogen atmosphere to anneal the aluminum metal-semiconductor interface in order to ensure a low contact resistance and proper adhesion of the metal to the semiconductor.

A third photo-lithography step is carried out to mask those areas on the back surface of the wafer with photo-resist where aluminum and polysilicon were etched and washed. With the photo-resist mask in place, a second metal layer that is suitable for soldering purposes, for example, silver, nickel, tin, gold, copper, etc., is laid down by thermal evaporation, sputtering, electroplating, paint-on, or any other suitable technique on the back side of the wafer to an adequate thickness, usually from 1 to 10 micrometers. In particular, a titanium-gold layer with thickness of about 300 Angstroms of Ti and 1.0 micrometer of gold was deposited on the surface-connectable SCB elements of one embodiment of the present invention. The titanium acts as a binding layer between the aluminum and gold layers, thus enhancing the adherence of the gold film and improving the heat transfer efficiency during the soldering process. During the deposition of this second metal layer on the back side surface, the front surface of the wafer (where the active area of the SCB has been defined) is protected, for example, with photo-resist, to avoid metal deposition on the bridge area Removal of the photo-resist mask proceeds by the lift-off technique which removes the metal on it. In this way the titanium-gold layer stays only on the aluminum/polysilicon pads previously described.

The wafer is then taken to an electrical testing station where resistance of every SCB element is checked. The appearance of the die is also inspected under a microscope. Electrically and visually bad dies are marked and subsequently discarded.

Finally, the wafers are cut with a dicing saw which is thinner than that used to cut the front surface grooves 60 and back surface grooves 64 in order to separate the individual SCB elements from the wafer and from each other. This time the dicing cuts are passed entirely through the wafer to separate rows and columns of dies as previously defined by the location of the apertures.

Figure 6:
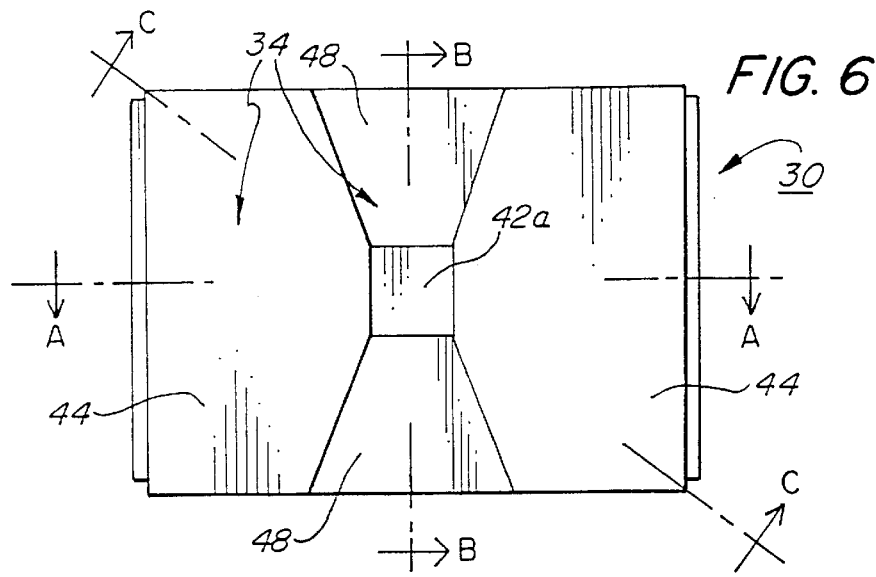
FIG. 6 is a schematic top plan view of a surface-connectable semiconductor bridge element in accordance with an embodiment of the present invention.
Figure 6A:
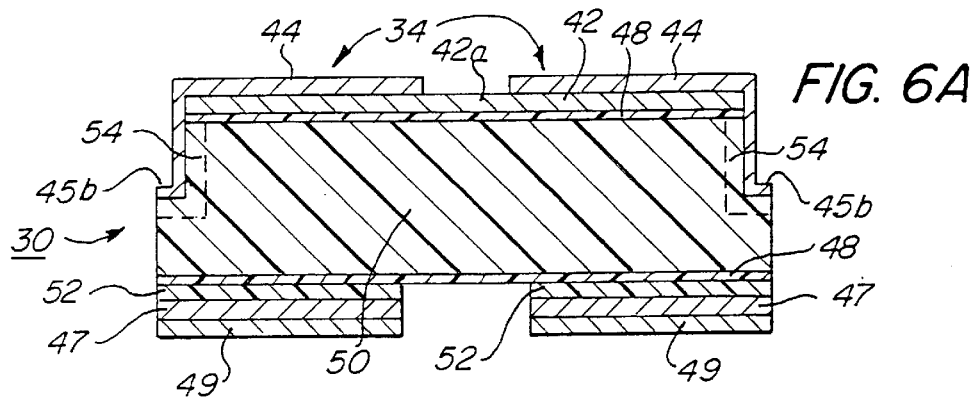
FIGS. 6A, 6B and 6C are cross-sectional views taken along, respectively, lines A—A, B—B and C—C of FIG. 6.
Figure 6B:
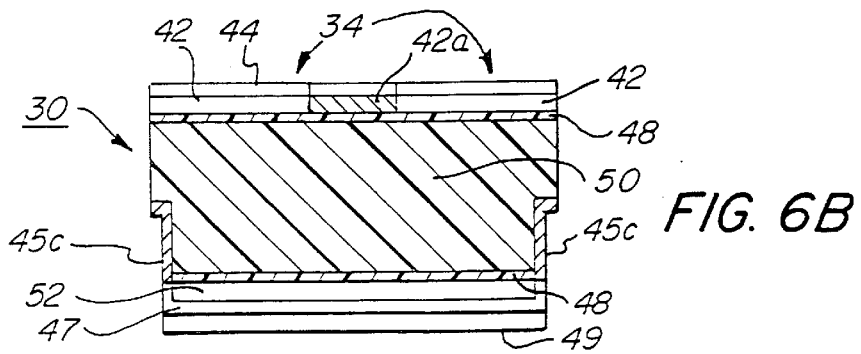
Figure 6C:
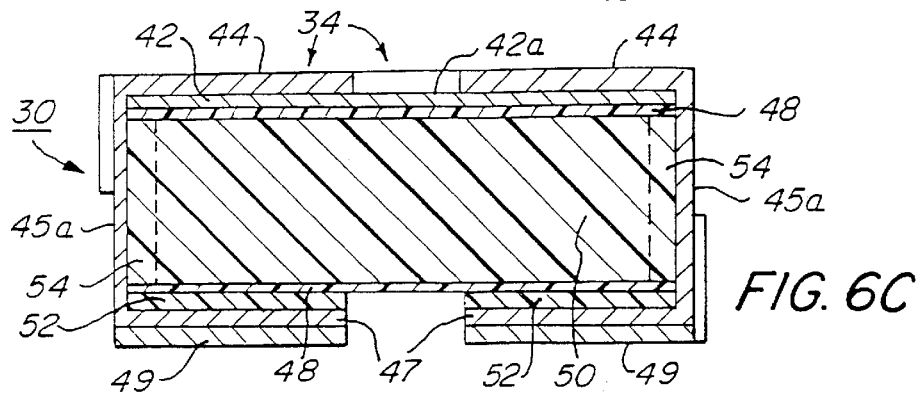

FIGS. 6 through 6E illustrate SCB 30, shown schematically in FIG. 4, in somewhat more detail. SCB 30, as illustrated in FIGS. 6–6E, is a typical product of the above-described process of manufacturing a plurality of silicon semiconductor elements from a wafer, as illustrated in FIGS. 5–5C. The components of SCB 30 which are illustrated in FIG. 4 are identically numbered in FIGS. 6–6E, and the description thereof is not repeated.

FIG. 6 shows a plan view and FIG. 6D a perspective view of the top surface 34 of SCB 30; FIG. 6E shows the bottom surface 35 of SCB 30. SCB 30 comprises an electrically non-conducting substrate 50 which, as is well known in the art, may comprise any suitable electrically non-conducting material and may comprise a monocrystalline silicon substrate. As described, for example, in the aforementioned U.S. Pat. No. 4,708,060 of R. W. Bickes, Jr. et al, metallized lands 44 formed in the configuration illustrated in FIG. 6 and 6D overlie a semiconductor material, such a, a heavily doped silicon semiconductor 42. The latter is disposed upon substrate 50 in a "bow tie" configuration comprising two pads of relatively large surface area (overlain by metal lands 44) and a small bridge or active layer 42a connecting the two large pads. A similar structure is shown in co-pending patent application Ser. No. 08/644,008 of Bernardo Martinez-Tovar et al entitled "Semiconductor Bridge Element and Method of Making the Same".

When an electric potential is applied across lands 44, the active area 42a of semiconductor layer 42 becomes conducting and when a current of sufficient intensity is applied for a sufficient length of time, active area 42a erupts with the formation of a plasma, which will serve to provide a heat source for use in, e.g., initiating explosive materials packed in contact with active area 42a. SCB 30, as best seen in FIGS. 6A, 6B, 6D and 6E, is of stepped configuration at the sides. This stepped structure results from the fact that SCB 30 has been prepared by a method as illustrated in FIGS. 5C, in which front surface grooves 60 and back surface grooves 64 are cut with dicing saws, which are wider than the dicing saws subsequently used to separate the individual SCBs. Thus, in FIG. 5B, a relatively thin dicing saw is positioned midway along the width of front surface grooves 60, for example, along line C—C in FIG. 5B, to cut through the wafer to separate the individual semiconductor elements therefrom. Corresponding thin-blade cuts are made along each of front surface grooves 60 and back surface grooves 64 to separate the individual semiconductor elements from the wafer substrate 56 and from each other. As explained above, because front surface grooves 60 and back surface grooves 64 intersect, through-holes or apertures (unnumbered) are formed in the wafer substrate 56 and provide a path for deposition of metals and dopants. Consequently, upon deposition such as chemical vapor deposition of the metal which forms metal lands 44, the metal is also deposited on the side surfaces 66a, 66b and 66c (FIG. 6E). Side surface 66b is seen to be a ledge or projection between side surfaces 66a and 66c. Side surface 66b is a longitudinal segment of the bottom of a front or back surface groove, and side surface 66c is made by the cut of the relatively thin dicing saw.

A similar procedure results in the stepped configuration of side surfaces 68a, 68b, 68c, which extend transversely to side surfaces 66a, 66b, 66c. (In FIGS. 6D and 6E, small portions of the metal layer overlying the side surfaces are broken away for clarity of illustration.)

The through-holes or apertures formed in wafer substrate 56 (FIGS. 5–5C) provide, as illustrated in FIG. 5C, a pathway for deposition of metal by, e.g., a chemical vapor deposition process, so that the metal layer forming lands 44 extends continuously to provide electrical connectors 45a, 45b, 45c, which serve to connect metal lands 44 with contact lands 47 (FIG. 6E). In FIGS. 6D and 6E connectors 45a and 45b are shown partially broken away in order to show a portion of side walls 68a and 68b. Contact lands 47 are covered by a layer of bonding metal 49, in order to promote effective and efficient soldering of the SCB 30 to a header 36 as illustrated in FIG. 3.

The bonding metal 49 may comprise gold or other suitable metal such as nickel or silver, in order to provide higher quality solder joints 38 (FIG. 3).

A continuous metal layer is seen to provide lands 44, connectors 45a, 45b and 45c and contact lands 47, thereby providing a continuous electrically conductive path on SCB 30 extending from the front surface 34 along the side surfaces 66a, 66b and 66c and 68a, 68b and 68c, thence to the rear surface 35. The resulting structure of flat, planar contact lands 47, optionally overlain by a thin layer of bonding metal 49, provides electrical contacts which are dimensioned and configured to be electrically connected by being directly mounted upon a header, and soldered or otherwise connected to electrical contacts in a manner such as that illustrated in FIG. 3, wherein solder 38 connects the back surface of the SCB 30 to electrical leads 32.

While the invention has been described in detail with reference to specific embodiments thereof, it will be appreciated that numerous variations thereto will nonetheless lie within the scope of the appended claims.

What is claimed is:

1. A surface-connectable semiconductor element comprising:
   (a) a substrate made from silicon semiconductor material having a top surface, a bottom surface and side surfaces;
   (b) a dielectric layer disposed on at least one surface of the substrate;
   (c) a polysilicon film disposed on the dielectric layer;
   (d) a metal layer mounted on the polysilicon layer and extending from the top surface, along the side surfaces, to the bottom surface with the metal layer configured to form contacts on the bottom surface which contacts are configured for surface mounting directly on a header; and
   wherein the substrate is selected from the class consisting of p-type substrates and n-type substrates and the polysilicon film and the side surfaces of the substrate are doped with a dopant selected from the class consisting of a p-dopant and an n-dopant, provided that when the substrate comprises a p-dopant the polysilicon film and the side surfaces are doped with an n-dopant, and when the substrate comprises an n-dopant the polysilicon film and the side surfaces are doped with a p-dopant, whereby back-to-back diode means are formed between different ones of the side surfaces to provide the semiconductor element with unbiased protection against electrostatic discharge.

2. A surface-connectable semiconductor bridge element comprising:
   (a) a substrate made from silicon semiconductor material having a top surface, a bottom surface and side surfaces;
   (b) a dielectric layer disposed on at least one surface of the substrate;
   (c) a polysilicon film disposed on the dielectric layer; and
   (d) a metal layer mounted on the polysilicon layer and extending from the top surface, along the side surfaces to the bottom surface wherein the metal layer is configured to be in contact with at least a portion of one surface of the substrate, and wherein the metal layer is configured to form contacts on the bottom surface which contacts are configured for surface mounting directly on a header;
   wherein the polysilicon film and the metal layer are configured to provide at least two separate electrical contacts on the bottom surface and a semiconductor bridge circuit geometry on the front surface.

3. A surface-connectable semiconductor element comprising:
   (a) a substrate made from silicon semiconductor material having a top surface, a bottom surface and side surfaces;
   (b) a dielectric layer disposed on at least one surface of the substrate;
   (c) a polysilicon film disposed on the dielectric layer; and
   (d) a metal layer mounted on the polysilicon layer and extending from the top surface, along the side surfaces, to the bottom surface with the metal layer configured to form contacts on the bottom surface which contacts are configured for surface mounting directly on a header; the element being made by manufacturing it as part of a plurality of such semiconductor elements from a substrate wafer having a front surface and a back surface, the elements being made by a method comprising the steps of:
   (a) coating at least one surface of a silicon substrate wafer with a dielectric layer;
   (b) depositing a polysilicon film on the dielectric layer;
   (c) forming a plurality of openings in the substrate wafer, which openings extend through the wafer from the front surface to the back surface thereof to define side surfaces which extend from the front surface to the back surface of the wafer, the openings being located so that a plurality of dies to be cut from the substrate wafer each has an opposed pair of the side surfaces;

(d) depositing a metal layer on the wafer and through the openings onto the front, back and side surfaces to provide a continuous electrically conductive path on the dies between the front surface and the back surface via the side surfaces to constitute the semiconductor elements from the dies;

(e) masking and etching the polysilicon film and the metal layer to form the contacts on the bottom surface; and (f) separating the semiconductor elements from the substrate wafer and from each other.

4. The element of claim 1 comprising a semiconductor bridge element wherein the polysilicon film and the metal layer are configured to provide at least two separate electrical contacts on the bottom surface and a semiconductor bridge circuit geometry on the front surface.

5. The element of claim 1 wherein the silicon substrate comprises a p-type silicon substrate and the polysilicon film and the side surfaces are doped with an n-type dopant.

6. The element of claim 1 wherein the silicon substrate comprises an n-type silicon substrate and the polysilicon film and the side surfaces are doped with a p-type dopant.

7. The element of claim 3 comprising a semiconductor bridge element made by a method wherein step (e) comprises masking and etching the polysilicon film and the metal layer to form at least two separate electrical contacts on the bottom surface and a semiconductor bridge circuit geometry on the front surface.

8. The element of claim 1 or claim 2 wherein at least one side surface includes a stepped portion.

9. The element of claim 1, claim 4 or claim 2 wherein the substrate has a resistivity in the range of from about 0.01 to 10 ohm-cm, the dielectric layer has a thickness in the range of from about 0.2 to 1 micrometer, and the polysilicon film has a thickness in the range of from about 1 to 3 micrometers.

10. The element of claim 1, claim 4 or claim 2 in combination with a header having electrical contacts, wherein the element is surface mounted directly on the header by soldering the contacts of the bottom surface of the element to the electrical contacts of the header.

11. The element of claim 1, claim 4 or claim 2 forming part of an explosive element and having the bridge circuit geometry thereof disposed in contact with an explosive material.

12. The element of claim 1 or claim 3 wherein the metal layer is configured to provide at least two respective sections, each extending continuously from the top surface, along at least one of the side surfaces to the bottom surface and forming at least one contact on the bottom surface.

13. The element of claim 1 or claim 3 comprising a semiconductor bridge element wherein the polysilicon film and the metal layer are configured to provide at least two separate electrical contacts on the back surface and a semiconductor bridge circuit geometry on the front surface.

* * * * *